(12) United States Patent
Shan et al.

(10) Patent No.: US 11,257,563 B2
(45) Date of Patent: Feb. 22, 2022

(54) APPARATUS AND METHOD FOR TESTING A DEFECT OF A MEMORY MODULE AND A MEMORY SYSTEM

(71) Applicant: MONTAGE TECHNOLOGY CO., LTD., Shanghai (CN)

(72) Inventors: Gang Shan, Shanghai (CN); Yong Zhang, Shanghai (CN)

(73) Assignee: MONTAGE TECHNOLOGY CO., LTD., Shanghai (CN)

( * ) Notice: Subject to any disclaimer, the term of this patent is extended or adjusted under 35 U.S.C. 154(b) by 0 days.

(21) Appl. No.: 16/919,113

(22) Filed: Jul. 2, 2020

(65) Prior Publication Data
US 2021/0313000 A1    Oct. 7, 2021

(30) Foreign Application Priority Data

Apr. 3, 2020 (CN) ......................... 202010259928.7

(51) Int. Cl.
*G11C 29/38* (2006.01)
*G11C 29/44* (2006.01)
*G11C 29/50* (2006.01)

(52) U.S. Cl.
CPC .......... *G11C 29/38* (2013.01); *G11C 29/4401* (2013.01)

(58) Field of Classification Search
None
See application file for complete search history.

(56) References Cited

U.S. PATENT DOCUMENTS

| 4,656,610 A | * | 4/1987 | Yoshida | G11C 29/83 365/189.07 |
| 6,134,143 A | * | 10/2000 | Norman | G11C 16/06 365/185.07 |

(Continued)

OTHER PUBLICATIONS

Kokrady et al., Memory Yield Improvement through Multiple Test Sequences and Application-Aware Fault Models, IEEE, Conference Paper, pp. 169-174 (Year: 2008).*

*Primary Examiner* — Cynthia Britt
*Assistant Examiner* — Dipakkumar B Gandhi
(74) *Attorney, Agent, or Firm* — Jun He Law Offices P.C.; James J. Zhu

(57) ABSTRACT

The present application discloses an apparatus for testing defects of a memory module comprises a central buffer for generating a test write command and a test read command to indicate testing to a target address in a memory module; and a data buffer coupled to the central buffer to receive the test write command and the test read command; the data buffer is configured to, in response to the test write command, use target data as repair data corresponding to the target address, and write the target data into the memory module; and, in response to the test read command, to read target data from the target address and compare the target data with the repair data, and to send to the central buffer a comparison result of the target data and the repair data; the central buffer is further configured to record the target address as a tested address when generating the test write command, and determine whether to add the tested address to defective address information based on the comparison result associated with the tested address, defective address information is to indicate one or more defective memory addresses in the memory module.

17 Claims, 8 Drawing Sheets

(56) References Cited

U.S. PATENT DOCUMENTS

| | | | | |
|---|---|---|---|---|
| 6,460,152 | B1* | 10/2002 | Demidov | G01R 31/31935 |
| | | | | 365/201 |
| 6,934,205 | B1* | 8/2005 | Pandey | G06F 11/27 |
| | | | | 365/200 |
| 2001/0006481 | A1* | 7/2001 | Daehn | G11C 29/80 |
| | | | | 365/201 |
| 2002/0133742 | A1* | 9/2002 | Hsu | G06F 12/0215 |
| | | | | 714/6.13 |
| 2010/0074039 | A1* | 3/2010 | Kondo | G11C 29/846 |
| | | | | 365/200 |
| 2016/0217086 | A1* | 7/2016 | Shan | G06F 21/6218 |

* cited by examiner

APPARATUS AND METHOD FOR TESTING A DEFECT OF A MEMORY MODULE AND A MEMORY SYSTEM

FIELD OF THE INVENTION

The disclosure relates to memory technology, and in particular, to an apparatus and method for testing a defect of a memory module and a memory system.

BACKGROUND

In current computer systems, a volatile memory is generally configured as a main memory, such as dynamic random access memory (DRAM), etc., which is configured to temporarily store the operation data from the central processing unit (CPU). The main memory generally includes one or more memory arrays, and each memory array includes a great amount of memory cells which are arranged in an array.

Certain specific memory cells in a main memory may be damaged due to various reasons during the production or use of the main memory. If these damaged memory cells cannot be tested and repaired, the entire main memory cannot be used. Current memory testing technology can generally only test and repair damaged memory cells offline, and a special test software and device are required for assisting the test, rendering a high cost for the test.

Therefore, it is desired to provide an improved apparatus and method for testing a defect of a memory.

SUMMARY

An objective of the present application is to provide an apparatus and method for testing a defect of a memory.

In some aspects of the present application, an apparatus for testing defects of a memory module is provided, the apparatus comprises: a central buffer for receiving an access command for accessing the memory module, and for generating a test write command and a test read command to indicate testing to a target address in the memory module; and a data buffer coupled between a memory interface and the memory module to buffer data transmitted therebetween, and coupled to the central buffer to receive the test write command and the test read command; wherein the data buffer is configured to, in response to the test write command, use target data as repair data corresponding to the target address and write the target data into the memory module; and, in response to the test read command, to read target data from the target address and compare the target data with the repair data, and to send to the central buffer a comparison result of the target data and the repair data; wherein the central buffer is further configured to record the target address as a tested address when generating the test write command, and determine whether to add the tested address to defective address information based on the comparison result associated with the tested address, wherein the defective address information is to indicate one or more defective memory addresses in the memory module.

In some embodiments, the central buffer has an address recording module for recording the defective address information and the tested address; the central buffer is coupled to a memory interface for receiving from the memory interface a write command to write data into the target address, and when the target address included in the write command is not included in the defective address information and the address recording module has unoccupied address recording space, the central buffer is configured to generate the test write command to indicate testing to the target address included in the write command; or receive from the memory interface a read command to read data from the target address, check whether the target address included in the read command is a tested address, and generate the test read command when it is determined that the target address included in the read command is a tested address.

In some embodiments, the central buffer further comprises: an address generation module for generating one or more target addresses in the memory module based on a predetermined address generation algorithm; and a control module for indicating the address generation module to generate the target addresses and provide the test write command or test read command to the data buffer, and determine whether to add the tested address to the defective address information based on the comparison result.

In some embodiments, the data buffer further comprises: a data generation module for generating target data based on a predetermined data generation algorithm in response to the test write command, wherein the target data corresponds to the target address included in the test write command; a comparator for comparing the repair data with the target data read from the target address; and an error reporting module for providing a comparison result between the repair data and the target data to the central buffer.

In some embodiments, the data buffer further comprises a data recording module for receiving and recording the target data from the data generating module as the repair data; and the comparator is also configured to receive the repair data from the data recording module.

In some embodiments, the comparator is further configured to receive the target data from the data generation module as the repair data.

In some embodiments, the data buffer further comprises a data recording module for recording the repair data.

In some embodiments, the apparatus further comprises a non-transitory memory medium, and the central buffer is further configured to store the defective address information in the non-transitory memory medium.

In some embodiments, the central buffer is further configured to compare a target address included in a received access command with defective address information, and determine whether to generate a repair access command to repair the target address according to a comparison result of the target address included in the received access command and the defective address information; and the data buffer further comprises a data recording module for recording repair data, and is configured for according to the repair access command, writing target data associated with the access command into the data recording module as repair data corresponding to a target address, or reading repair data from the data recording module as target data corresponding to a target address.

In another aspects of the present application, a method for testing defects of a memory module is provided, the memory module is coupled to a central buffer and a data buffer which are coupled to each other, wherein the central buffer and the data buffer are also respectively coupled to a memory interface, the method comprises: a) generating via the central buffer a test write command to indicate testing to a target address in the memory module, and recording the target address as a tested address; b) in response to the test write command, using via the data buffer the target data as repair data corresponding to the tested address, and writing the target data into the memory module; c) generating via the central buffer a test read command to indicate testing to the tested address; d) in response to the test read command reading, via the data buffer target data from the tested address, comparing the target data with the repair data, and sending a comparison result of the target data and the repair data to the central buffer; and e) determining via the central buffer whether to add the tested address to defective address information based on a comparison result associated with the tested address, wherein the defective address information is to indicate one or more defective memory addresses in the memory module.

The foregoing is the summary of the present application, which may be simplified, summarized, and details omitted. Therefore, those skilled in the art should recognize that this part is merely an illustrative example and is not intended to limit the scope of the application in any way. This summary is neither intended to identify the key or required characteristics of the subject matter claimed to be protected nor is it intended to be an adjunct to determining the scope of the subject matter claimed to be protected.

BRIEF DESCRIPTION OF THE DRAWINGS

The above and other features of the content of the present application will be more completely and clearly understood through the following description in view of the appended claims and the drawings. It can be understood that these drawings only illustrated several embodiments of the content of the present application, and therefore should not be considered as defining the scope of the content of the present application. The content of the present application will be more clearly and detailed specified through the adoption of the drawings.

DETAILED DESCRIPTION OF THE DRAWINGS

Figure 1:
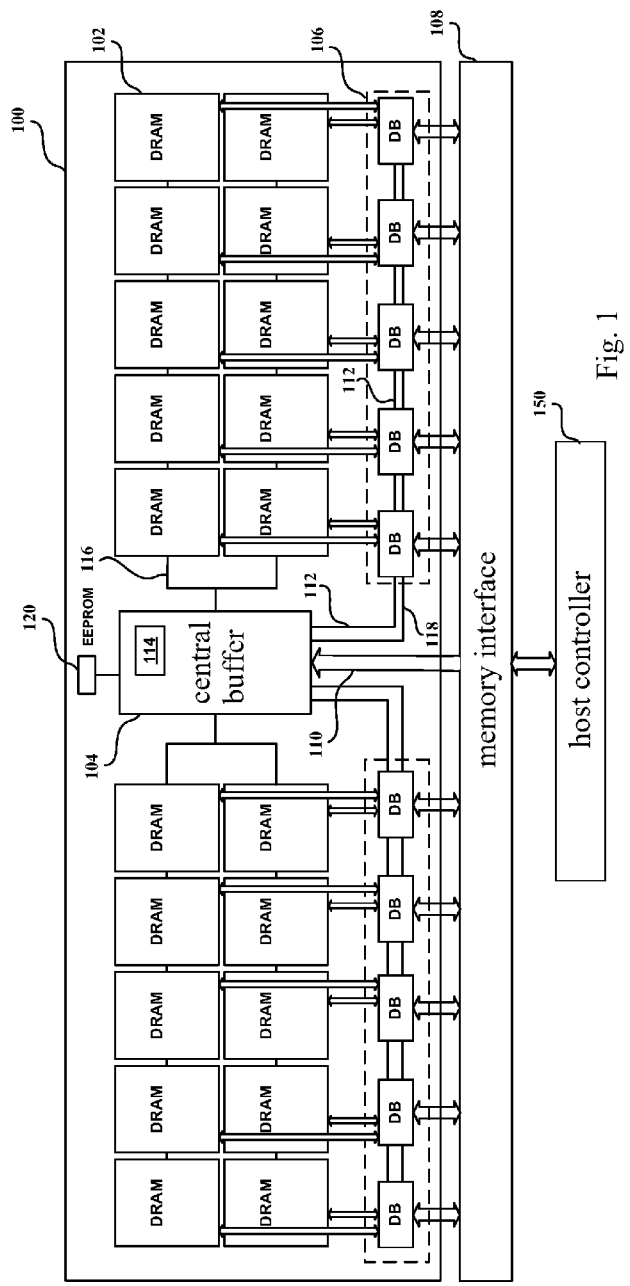
FIG. 1 illustrates a memory system according to an embodiment of the present application.

The following detailed description refers to the drawings that form part of it. In the drawings, similar symbols generally indicate similar components, unless context indicates otherwise. The illustrative embodiments described in the detailed description, drawings, and claims are not intended to define. Other embodiments may be adopted and other changes may be made without departing from the concept or scope of the subject matter of the present application. It can be understood that various aspects of the content of the present application, which are generally described in the present application and illustrated in the drawings, may be arranged, replaced, combined, and designed in various configurations, all of which clearly constitute a part of the content of the present application.

FIG. 1 shows a memory system 100 according to an embodiment of the present application. The memory system 100 has a function of repairing and/or testing one or more defects of a memory module, and is compatible with current standard memory systems. In some embodiments, the memory system 100 may be a memory system that conforms to the JEDEC double data rate synchronous dynamic random access memory (SDRAM) standard, such as JEDEC DDR, DDR2, DDR3, DDR4, DDR5, and other double data rate standards. In addition, the memory system 100 may also be an internal memory that conforms to other standards or protocols, such as RAMBUS internal memory, or may be a memory that conforms to future memory standards or protocols.

As shown in FIG. 1, the memory system 100 includes a plurality of memory modules 102 (exemplarily illustrated as DRAM in the figure), wherein each memory module 102 includes a plurality of memory cells which are arranged in an array. In some embodiments, the memory module may include a volatile memory (such as dynamic random access memory), non-volatile memory (flash memory, such as NAND or NOR flash memory), or a combination of both volatile and non-volatile memories. In other embodiments, the memory module may also be a new type of memory manufactured using different processes, including but not limited to: magnetoresistive memory, phase-change memory, resistive memory, semi-floating gate memory, or any other type of memory. It should be noted that the memory module described herein may be a single memory chip, or may include two or more memory chips. In the memory system 100 shown in FIG. 1, a plurality of memory modules 102 are arranged into two groups of memory modules, and each group of memory modules constitutes a memory rank of the memory system 100 to store data.

The memory system 100 also includes a central buffer 104 and a data buffer (DB) 106. In some embodiments, the central buffer 104 may be a registering clock driver. Specifically, the central buffer 104 is coupled to the memory interfaces 108, and receives an access command including a target address and an access type via the memory interface 108. The access command may be a control command to access (such as, to read or to write) one or more target addresses in the memory module 102. The memory interface 108 is further coupled to a host controller 150 to receive an access command and/or target data to be written into the memory system 100 from the host controller 150, or send target data read from the memory system 100 to the host controller 150. In some embodiments, the central buffer 104 receives an access command via the command/address (C/A) bus 110. The central buffer 104 is also coupled to each memory module 102 via a memory control bus 116 to control these memory modules 102 to write or to read data via the data buffer 106.

The data buffer 106 is coupled between the memory module 102 and the memory interface 108 to exchange data therebetween. For example, the target data stored in the memory module 102 can be read out and sent to the memory interface 108 via the data buffer 106, or the target data received from the memory interface 108 via the data buffer 106 can be written into the corresponding memory cell(s) in the memory module. The data buffer 106 includes a plurality of submodules (for example, 10 submodules shown in the embodiment in FIG. 1), and each submodule is coupled to the corresponding two memory modules 102. The data buffer 106 including a plurality of submodules arranged in parallel can increase a data access bandwidth of the memory system 100. It can be understood that the present application does not limit the amount of submodules of the data buffer 106.

In practical applications, the memory module 102 may have a small amount of defective memory cells due to production problems or long-term use. Therefore, data written into the defective memory cells may be inconsistent with the data read from the defective memory cells during some access operations, that is, an error occurs. It can be understood that in a process of accessing the defective memory cells, the data read from the memory cells may not be inconsistent with the written data every time, but there is a probability from statistical perspective. Generally, the probability that a memory cell is defective is positively associated with the number of times that data read from the memory cell is inconsistent with that written into it.

In order to repair these defective memory cells and avoid discarding a memory system due to the existence of a few defective cells, the memory system 100 shown in FIG. 1 integrates an apparatus for repairing memory defects according to an embodiment of the present application. The repair apparatus may identify a defective memory address, and temporarily store target data in another storage space that can be easily accessed by the data buffer after identification, instead of storing in a memory cell with a defect (hereinafter, also referred to "defective memory cell") directed by the defective memory address. In this way, in the subsequent read operation, the data stored in the another storage space may replace the data stored in the defective memory cell (regardless of whether the data stored in the defective memory cell is in consistency or inconsistency with the original target data), thereby repairing the defect of the memory module.

Specifically, the central buffer 104 includes an address recording module 114, which is configured to record defective address information, and the defective address information is to indicate an address of a defective memory cell in the memory module 102 (hereinafter, also referred to as "defective memory address"). In some embodiments, the address recording module 114 may include a plurality of address recording units, each of which is used to record a defective memory address and may be identified by a record number. In some embodiments, the address recording module 114 may be implemented by registers, which are compatible with the current register structure of the central buffer 104.

It can be seen that since the address recording module 114 in the central buffer 104 stores the defective address information, the central buffer 104 can directly compare the target address included in the received access command with the defective address information. If the target address is in consistency with a defective memory address included in the defective address information, which indicates that the target address may have a defect during data storage, it is desired to repair the defect or to avoid storing data in the target address. In such circumstances, the central buffer 104 may generate a repair access command indicating to repair the target address, and send the repair access command to the data buffer 106 via the data buffer control bus (BCOM) 112. In some embodiments, when a target address included in the access command is not included in the defective address information, that is, the memory cell corresponding to the target address has no defect, the central buffer 104 may not generate a repair access command but directly forward the received access command to the memory module 102 and the data buffer 106 in a normal processing manner. The specific implementation for sending the repair access command via the data buffer control bus 112 will be described in detail below.

The data buffer 106 may operate according to the received access command or repair access command. Specifically, in addition to a circuit structure for buffering data, each submodule of the data buffer 106 also includes a data recording module (not shown in the figure), which is configured to record repair data to replace potential incorrect data stored in a corresponding memory address of the memory module 102. The data buffer 106 may operate according to a repair access command, for example, to write target data received from the memory interface 108 into the data recording module as repair data corresponding to a target address during a repair write operation, or to read repair data from the data recording module as target data corresponding to a target address during a repair read operation.

In some embodiments, an access command and a repair access command may be distinguished by one or more identifiers. In some embodiments, these identifiers may include a one-bit repair identifier: when an access command carries a repair identifier with a value of "1", it may indicate that the access command is a normal access command; and when an access command carries a repair identifier with a value of "0", it may indicate that the command is a repair access command. In addition, these identifiers may also include a one-bit data interception identifier. The function of the interception identifier is to indicate whether the central buffer 104 and the data buffer 106 need to intercept, by copying, target data for repair or other purposes. In some embodiments, an interception identifier with a value of "0" indicates that an interception function is enabled, that is, it is desired to intercept target data to a data recording module, and the interception identifier with a value of "1" indicates that the interception function is disabled.

Figure 2A:
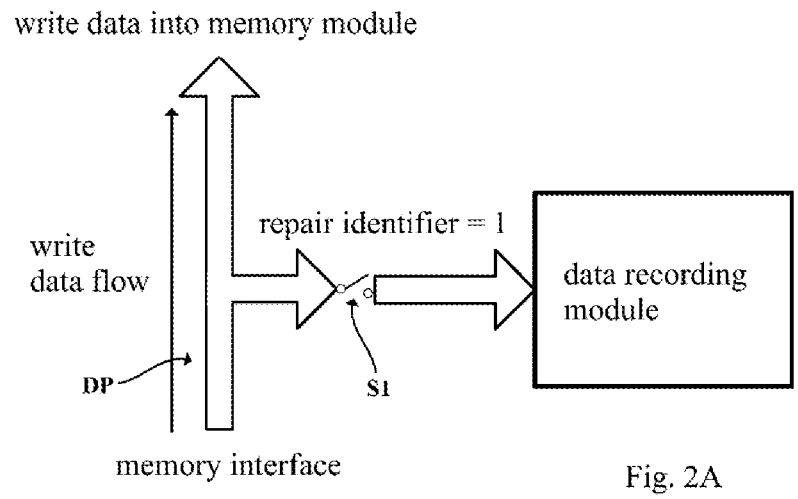
FIGS. 2A and 2B illustrate data flows of a data buffer in response to a write command and a repair write command, respectively.
Figure 2B:
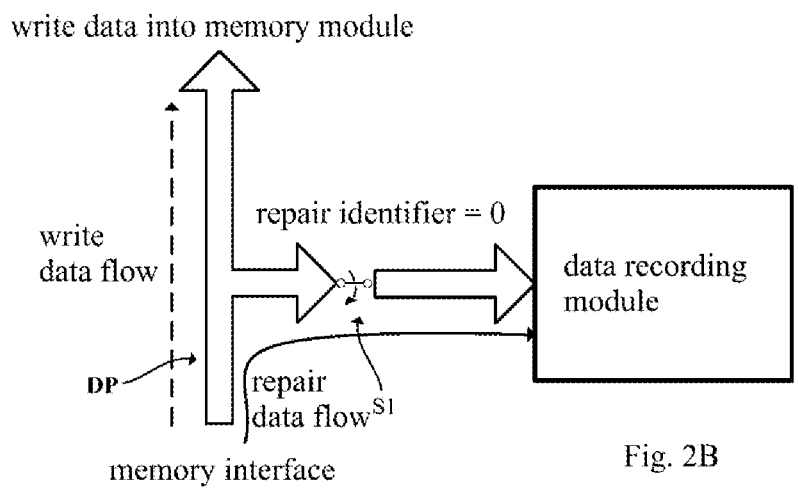

FIGS. 2A and 2B illustrate data flows of the data buffer in response to a write command and a repair write command, respectively.

Figure 3A:
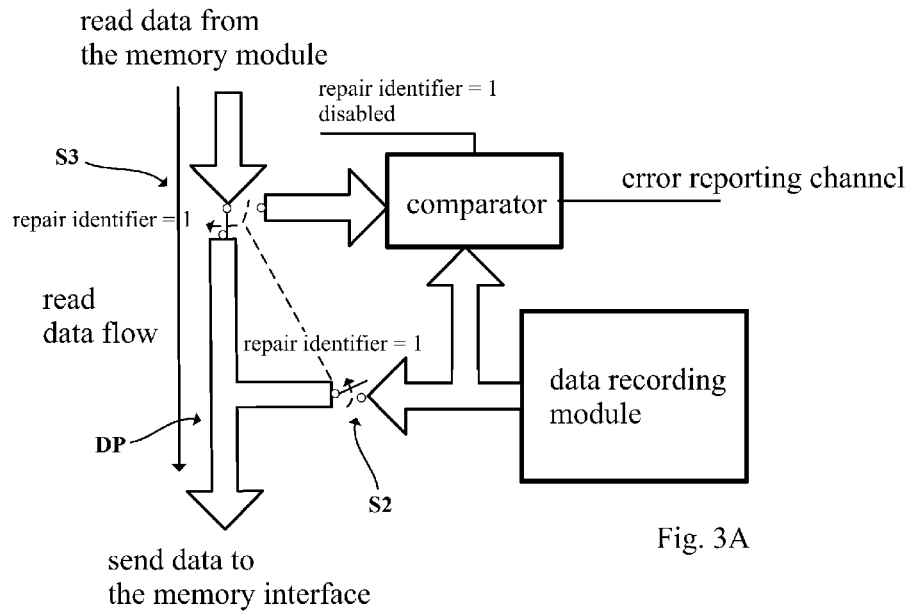
FIGS. 3A and 3B illustrate data flows of a data buffer in response to a read command and a repair read command, respectively.
Figure 3B:
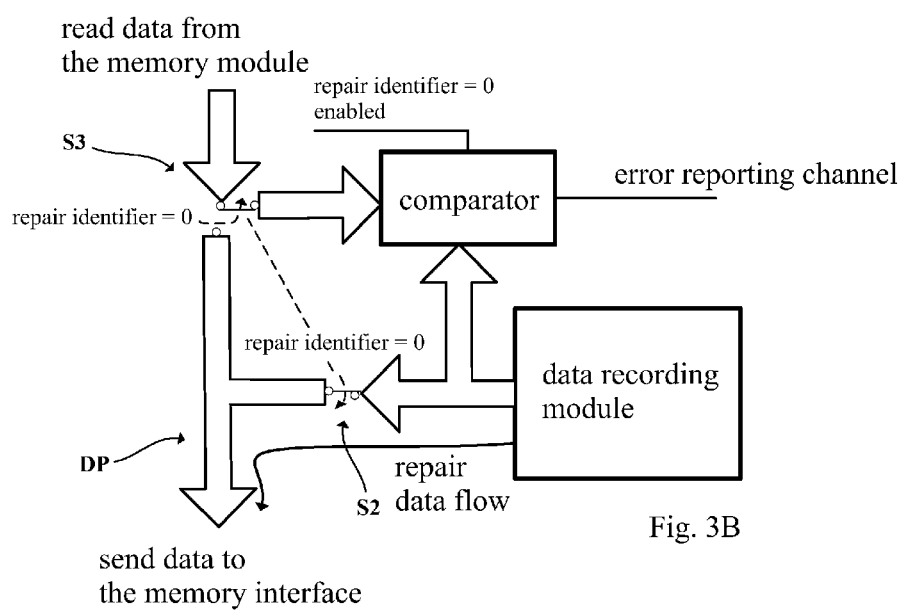

As shown in FIGS. 2A and 2B, each submodule of the data buffer can be provided with one or more intercept control switches S1 to S3, which are configured to control a connection between a data recording module and a data buffer path DP, and switched-on or switched-off state of the data buffer path DP itself (see the description of FIGS. 3A and 3B for details). Specifically, the intercept control switch S3 is coupled in the data buffer path DP, and the intercept control switches S1 and S2 are coupled between the data recording module and the data buffer path DP, where S1 is configured to control a unidirectional data flow from the data buffer path DP to the data recording module, and S2 is configured to control another unidirectional data flow from the data recording module to the data buffer path DP. In some embodiments, the intercept control switches S1 and S2 may be integrated as a bidirectional switch to control a bidirectional data flow between the data recording module and the data buffer path DP. The data buffer path DP is a data path for carrying data transmission between the memory module and the memory interface. The intercept control switch S1 can be controlled to be switched on or switched off according to a value of the interception identifier received by a control end of the switch S1. Specifically, as shown in FIG. 2A, when a command received by the data buffer is a normal write command which carries an interception identifier with a value of "1", the intercept control switch S1 is switched off in response to the write command. Accordingly, data is sent from the memory interface to the memory module via the data buffer path DP, and is further written into the memory module. As shown in FIG. 2B, when a command received by the data buffer is a repair write command which carries an interception identifier with a value of "0", the intercept control switch S1 is switched on in response to the repair write command. Accordingly, data can be at least written into the data recording module via the intercept control switch S1. Therefore, the data written into the data recording module can be used as repair data in subsequent access operations (e.g., in a read operation) to replace the data stored in the corresponding address of the memory module. In some embodiments, data may only be written into the data recording module in response to a repair write command; alternatively, data may be written into both the data recording module and the memory module at the same time.

FIGS. 3A and 3B illustrate data flows of the data buffer in response to a read command and a repair read command, respectively.

As shown in FIG. 3A, when the command received by the data buffer is a normal read command which carries an interception identifier with a value of "1", the intercept control switch S2 is switched off and the intercept control switch S3 is controlled to switch on the data buffer path DP in response to the command. Accordingly, the data stored in the memory module can be read out via the data buffer path DP and further sent to the memory interface via the data buffer. As shown in FIG. 3B, when the command received by the data buffer is a repair read command which carries an interception identifier with a value of "0", the intercept control switch S2 is switched on and the intercept control switch S3 is controlled to switch off the data buffer path DP in response to the repair read command. Accordingly, the data stored in the memory module cannot be read out, and instead, the repair data stored in the data recording module can be read out to replace the data stored in the corresponding address of the memory module.

Moreover, FIGS. 3A and 3B also illustrate a comparator and associated data flows. These data flows and control logic relate to the test of defective memory addresses of the memory module, which will be elaborated below.

It can be seen that in the embodiment shown in FIG. 1, by using defective address information recorded in the address recording module 114, the central buffer 104 may "repair" one or more defects of the memory module by generating a repair access command. In some embodiments, defective address information may be preset in the address recording module 114, and called in real time when the memory system 100 is accessed. However, this pre-set method may not be able to test new errors that occur during the use of the memory system 100, that is, it is not possible to test defective memory addresses and repair them similarly "online".

In order to solve the above problem, the repairing apparatus of the memory system shown in FIG. 1 also has a function of testing whether an accessed memory address is a defective memory address. Specifically, for each access command received, after determining that a memory address accessed by the access command is not a defective memory address, the central buffer 104 may check whether the address recording module 114 has unoccupied address recording space, and further record the target address in the address recording module 114 as a tested address after unoccupied address recording space is found. At the same time, the central buffer 104 also generates a test access command for indicating to check the tested address. After that, the central buffer 104 sends the test access command to the data buffer 106. Depending on whether a received access command is a write command or a read command, the central buffer 104 may generate a corresponding test write command or test read command.

Figure 4A:
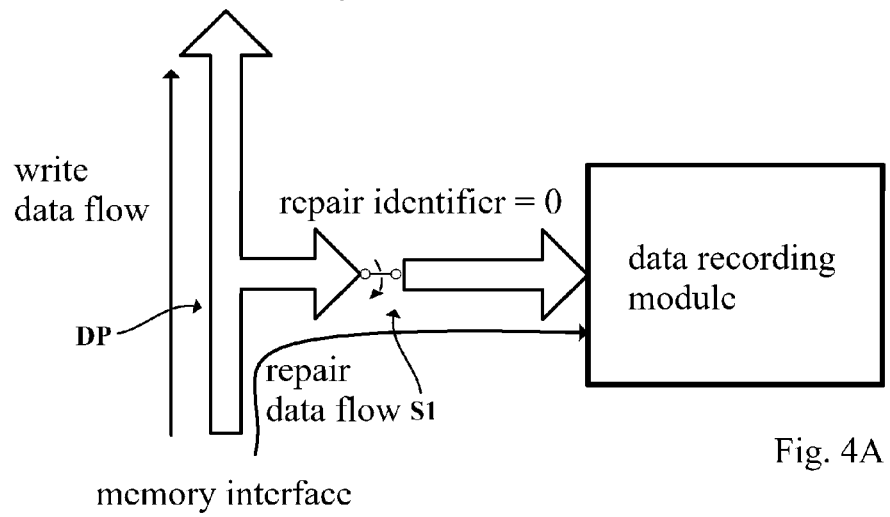
FIGS. 4A and 4B illustrate data flows of a data buffer in response to a test write command and a test read command, respectively.

FIG. 4A illustrates a data flow of the data buffer in response to a test write command. As shown in FIG. 4A, when a command received by the data buffer is a test write command which carries an interception identifier with a value of "0", the intercept control switch S1 coupled to the data recording module is switched on in response to the test write command, so that the data transmitted from the memory interface via the data buffer path DP can be written into the data recording module via the intercept control switch S1. Therefore, the data can be used as repair data in subsequent access operations (e.g. in a read operation). At the same time, in response to the test write command, the data may also be written into the memory cell corresponding to the tested address of the memory module. In other words, repair data (i.e., correct data) is recorded in the data recording module, which can be configured as a reference to determine whether the target data stored in the memory module is correct.

Figure 4B:
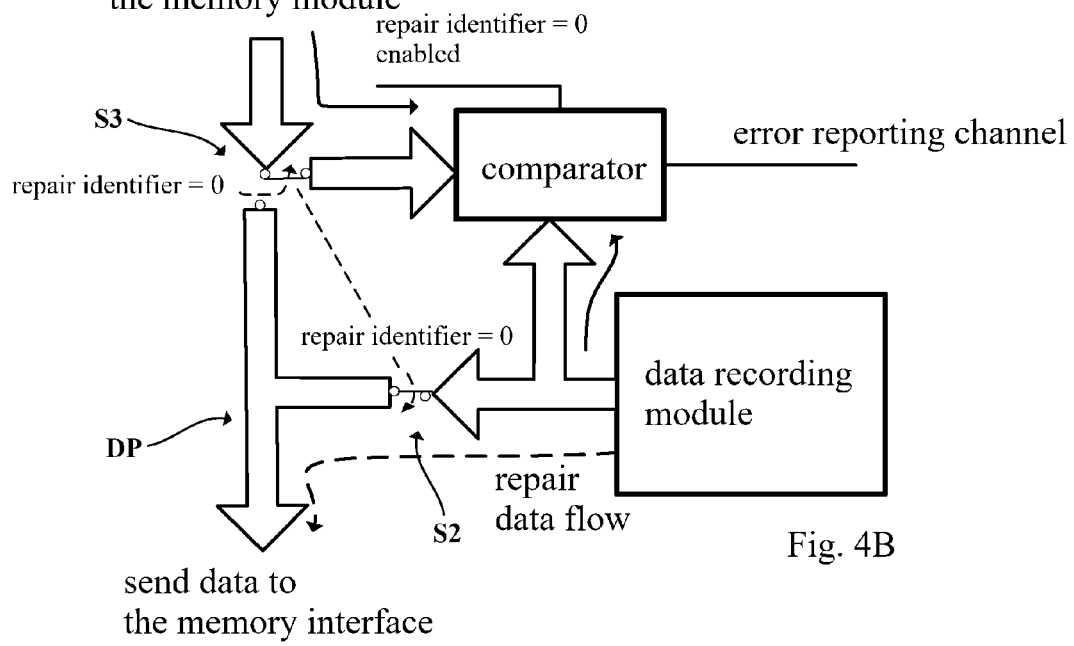

FIG. 4B illustrates a data flow of the data buffer in response to a test read command. As shown in FIG. 4B, when a command received by the data buffer is a test read command which carries an interception identifier with a value of "0", in response to the test read command, the intercept control switch S3 is switched so that target data read from a tested address of the memory module and transmitted in the data buffer path DP is sent to the comparator and the data buffer path DP is disconnected. At the same time, the repair data previously written into and stored in the data recording module can be sent to the comparator. In this way, the comparator may compare the received target data with the repair data to determine whether the two are in consistency. If the two are in consistency, it means that the target address accessed by the test access command has no defect and no repair is required. In contrast, if the two are inconsistent, it means that the target address accessed by the test access command has a defect and requires to be repaired. Correspondingly, the comparator may send the comparison result of the target data and the repair data to the central buffer. Additionally, the intercept control switch S2 coupled to the data recording module is switched on, thereby allowing the repair data in the data recording module to be read out to replace the data stored in the corresponding address of the memory module.

The central buffer can determine that the currently accessed target address (that is, the tested address) has a defect after receiving the error report. Therefore, the central buffer may store the target address in the address recording module. In this way, in subsequent access operations, the central buffer may determine that it is required to generate the repair access commands to repair the defect according to the target address stored in the address recording module, as indicated by the data flows shown in FIGS. 2B and 3B which will not be repeated herein.

Figure 5:
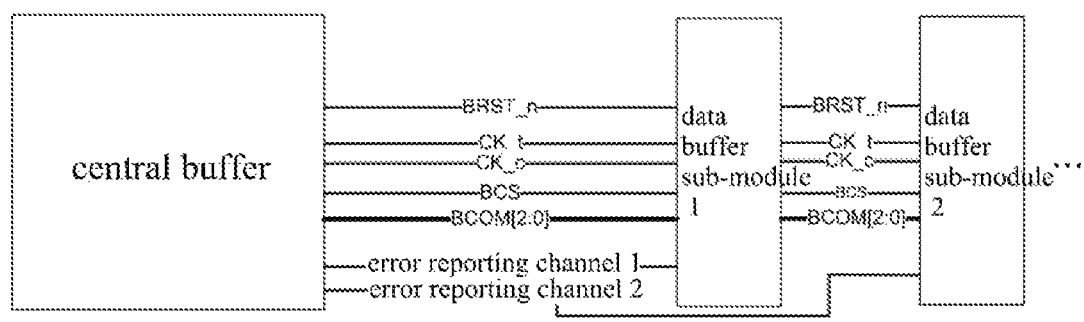
FIG. 5 illustrates a signal channel between a central buffer and a part of submodules of data buffers in the memory system shown in FIG. 1.

As shown in FIG. 4B, the comparator can send the comparison result of the target data and the repair data to the central buffer. In addition to the data buffer control bus 112 as a signal channel, an error reporting channel is provided between the data buffer 106 and the central buffer 104 in order to send the comparison result. FIG. 5 illustrates the signal channels between the central buffer 104 and the submodules of the data buffer 106 in the memory system 100 shown in FIG. 1, and Table 1 shows respective function definitions of signal lines of these signal channels. In some embodiments, each data buffer submodule may have an error reporting channel connected to the central buffer. In other embodiments, the data buffer submodules may share a single error reporting channel to the central buffer.

TABLE 1

Definition of Signal Lines of the Data Buffer

| Signal Line Names | Input or Output for Data Buffer | Function Definitions |
|---|---|---|
| BRST_n | input | BCOM reset |
| BCS_n | input | BCOM chip selection |
| BCK_t, BCK_c | input | Data buffer clock input |
| BCOM [2:0] | input | Data buffer control signals |
| error report | output | Error reporting signal |
| LBTXDQ, LBTXDQS | output | Loopback data signal |

As shown in FIG. 5 and Table 1, each data buffer is coupled to the central buffer via multiple signal lines. The signal lines BRST_n, BCS_n, BCK_t, BCK_c and BCOM [2:0] constitute the data buffer control bus. The central buffer may send various control signals and processed access commands to the data buffer via the data buffer control bus, so that the data buffer may access the corresponding memory cells in the memory module according to these access commands. The function of the data buffer control bus is the same as or similar to the relevant definitions in current memory standards (e.g. DDR4 or DDR5 standard), and the details will not be elaborated herein.

In some embodiments, each submodule of the data buffer is also coupled to the central buffer via an error reporting channel (such as the error reporting channel 118 shown in FIG. 1) to output an error reporting signal thereto. It can be understood that, in some embodiments, an error reporting channel may not be provided between the data buffer and the central buffer. Correspondingly, such memory system may not have a function of testing defective memory addresses.

Still referring to FIG. 1, the address recording module 114 integrated in the central buffer 104 is configured to record defective address information, as well as some status or control identifiers. In some embodiments, the address recording module may include 2 submodules, each of which is configured for one memory rank. In some other embodiments, each submodule of the address recording module may be configured for two or more memory ranks. Table 2 illustrates an address recording format used in the address recording module according to an embodiment of the present application. The fields "rank" to "chip ID" are used to store defective address information, while each of the fields "interception identifier" and "repair identifier" occupies one bit. In some embodiments, the address recording format further includes an "error count" field to record the number of times the corresponding defective memory address has an operation error. It can be understood that the greater the number of error counts, the greater the probability that the defective memory address has a defect, increasing the need to avoid using the address in subsequent operations. Correspondingly, for an address, it may be desired to change a repair identifier corresponding to an address for indicating a need of repair when the error count corresponding to the address reaches a preset threshold. It can be understood that, in some embodiments, the error count may not be set, so that once an error occurs for an address, the corresponding repair identifier may be modified to indicate the need of repair.

It can be understood that each defective memory address recorded in the address recording module 114 may be indexed by a record number. In some embodiments, up to 16 defective memory addresses may be recorded in the address recording module 114, and correspondingly, the record number may be represented by a 4-bit data.

TABLE 2

Address Record Format in the Address Recording Module

| Field | | Width |
|---|---|---|
| defective memory address | rank | 2 bits |
| | bank group | 3 bits |
| | bank address | 2 bits |
| | row address | 18 bits |
| | column address | 11 bits |
| | chip ID | 4 bits |
| interception identifier | | 1 bit |
| repair identifier | | 1 bit |
| error count | | 3 bits |

In some embodiments, both the address recording module and the data recording module may be implemented by registers, which only store information when the apparatus is powered on. Therefore, in some embodiments, the apparatus may further include a non-transitory memory medium, such as a flash memory, which is coupled to the central buffer and the data buffer to receive and store defective address information. In this way, the defective address information can be read from the non-transitory memory medium when desired (for example, when the apparatus is just powered on) to initialize the address recording module.

The data recording module in the data buffer is configured to store repair data. In some embodiments, each submodule of the data buffer may integrate with a data recording module to record data that the memory module coupled to the submodule of the data buffer acquires, which may be used in the repair operation. It can be understood that for a target address included in an access command, when reading or writing target data, each data buffer submodule buffers the corresponding data (if any) at the same time. For example, when receiving a repair access command, the data recording module in each data buffer submodule may also store the data buffered by the data buffer submodule where it resides, so that the data as a whole constitute data corresponding to the target address included in the access command. Therefore, preferably, each data recording module may have the same recording capacity, so that as a whole, these data recording modules may store a predetermined size of data as the repair data. In some embodiments, for example, the data recording module shown in Table 3 which has a capacity of 16 can store up to 16 pieces of repair data, so that each repair data can be marked with a record number of one of 0-15. For example, when the data buffer receives a repair access command, each data buffer submodule intercepts and stores the corresponding data in the data recording module inside the data buffer submodule.

It can be understood that each defective memory address recorded in the address recording module may be associated with the repair data recorded in the data recording module using record numbers. When receiving a repair write command, the data buffer allows its internal data recording module to be updated, and the data is updated to the corresponding recording position in the data recording module according to the record number transmitted on the data buffer control bus. When receiving a repair read command, the data buffer may obtain the corresponding repair data from the corresponding recording position of the data recording module according to the record number transmitted on the data buffer control bus, and send the repair data to the memory interface, and then the memory interface can send the repair data to the host controller.

Table 3 shows a data recording format that can be used in the data recording module. Specifically, a width of each data records may be 8*BL (Burst Length) bits+4 bits, where 8*BL bits are used to record repair data, and the repair identifier indicates whether the data corresponding to the record number requires to be repaired. The error count bits are used to record the number of errors occurred in the data identified by the corresponding record number (and associated memory address). In the example in Table 3, the error count bits occupy a 3-bit value, which means that after a maximum of 8 errors have occurred for an address, the repair identifier corresponding to the address for which the errors occur may be modified to indicate a need of repair.

TABLE 3

Data Record Format in the Data Recording Module

| Record Number | Repair Data | Repair Identifier | Error Count |
| --- | --- | --- | --- |
| 0 | 8 * BL | 1 bit | 3 bits |
| 1 | 8 * BL | 1 bit | 3 bits |
| 2 | 8 * BL | 1 bit | 3 bits |
| 3 | 8 * BL | 1 bit | 3 bits |
| 4 | 8 * BL | 1 bit | 3 bits |
| 5 | 8 * BL | 1 bit | 3 bits |
| 6 | 8 * BL | 1 bit | 3 bits |
| 7 | 8 * BL | 1 bit | 3 bits |
| 8 | 8 * BL | 1 bit | 3 bits |
| 9 | 8 * BL | 1 bit | 3 bits |
| 10 | 8 * BL | 1 bit | 3 bits |
| 11 | 8 * BL | 1 bit | 3 bits |
| 12 | 8 * BL | 1 bit | 3 bits |
| 13 | 8 * BL | 1 bit | 3 bits |
| 14 | 8 * BL | 1 bit | 3 bits |
| 15 | 8 * BL | 1 bit | 3 bits |

During the test access operation, the data buffer compares the repair data with the target data returned by the memory module. If the two are in consistency, it indicates that there is no error in the corresponding target address (the tested address) and the value of the repair identifier remains 1. If the two are inconsistent with each other, it indicates that the corresponding target address has a defect and may require a repair. At this time, the data buffer may increase the value of the error count corresponding to the target address by one. When the error count corresponding to the address exceeds a predetermined threshold, the repair identifier can be modified from 1 to 0, which indicates that the address is a defective memory address. If the error count does not reach the predetermined threshold, the value of the repair identifier remains 1, and the data in the field "repair data" (e.g., as shown in Table 3) in the data recording module is cleared such that the field can be used to store new data when an access to the same address is performed. In some embodiments, when no defective address information is read from a non-transitory storage medium, the field "repair identifier" can be set as a default value of all "1" and the fields "repair data" and "error count" can be set as default values of all "0" respectively, signaling non-existence of error in the memory module; however, the fields can be configured with the defective address information from the non-transitory storage medium during an initialization process, such as power on of the memory system. Similarly, if the repair identifier of an address is 0, it indicates that the data is written into the defective memory address. Accordingly, the corresponding repair data stored in the data recording module should be retained, and the data stored in the memory module will be replaced by it when the next access to the memory module is performed.

In order to be compatible with the processing of current data buffer control bus and access commands, in some embodiments, a repair access command and a test access command may be transmitted through the BCOM bus, and it is only needed to use one or more clock cycles to send the control identifier(s).

Table 4 illustrates signal formats of repair access commands and test access commands sent through the data buffer control bus 112. The signal formats defined in Table 4 may be compatible with formats of the access commands used in the current memory standards.

TABLE 4

Repair Access Commands and Test Access Commands

| time (Clock cycle) | BCS_n | BCOM [2:0] | Description of transmitted signals/commands/data |
| --- | --- | --- | --- |
| 0 | 1 | Prey Cmd | Previous access command or data transfer |
| 1 | 0 | WR/RD | Write command/read command; BCOM [2:0] = 010, write command; BCOM [2:0] = 011, read command; |
| 2 | 1 | DAT0 | Channel ID & BL; BCOM [0] = BL (burst data length), where equal to 0 means BC8 or BL32, equal to 1 means BL16; BCOM [1] = channel ID; 0 = channel 0, 1 = channel 1; BCOM [2] indicates whether the repair or test function is enabled, where 0 = enabled, and 1 = disabled; |
| 3 | 1 | DAT1 | Interception identifier, repair identifier and record number; BCOM [0] = interception identifier, where equal to 0 means that interception is enabled, and equal to 1 means that interception is disabled; |

TABLE 4-continued

Repair Access Commands and Test Access Commands

| time (Clock cycle) | BCS_n | BCOM [2:0] | Description of transmitted signals/commands/data |
|---|---|---|---|
| 4 | 1 | DAT2 | BCOM [1] = repair identifier, where 0 indicates that repair is enabled, and 1 indicates that repair is disabled; BCOM [2] = the highest bit of the record number Record number; BCOM [2:0] = the remaining bits of the record number |
| 5 | 1 | Next Cmd | Next access command |

It can be seen that by using up to 4 clock cycles on the data buffer control bus, the central buffer can send the current access command to the data buffer (BCOM [2] of DAT0 is set to 1 to disable the repair or test function), or send a repair access command or a test access command (BCOM [2] of DAT0 is set to 0 to enable repair or test function, and DAT1 as well as DAT2 send interception identifier, repair identifier and record number). This implementation may be well compatible with the current data buffer control methods.

Figure 6:
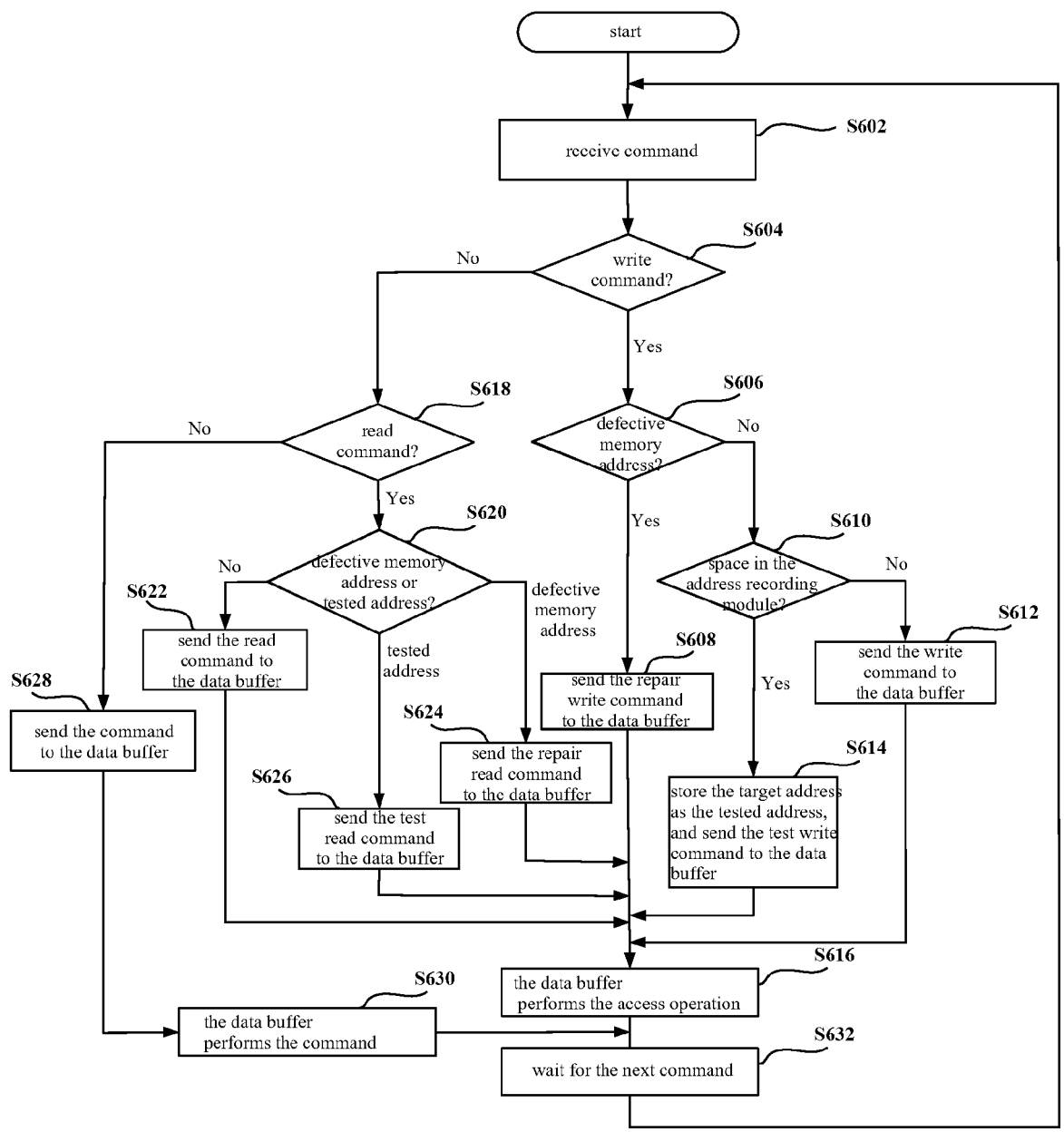
FIG. 6 illustrates a flowchart of a method for repairing a defect of a memory module according to an embodiment of the present application.

FIG. 6 illustrates a flowchart of a method for repairing defective memory module according to an embodiment of the present application. The method shown in FIG. 6 can be performed by the embodiment shown in FIG. 1.

As shown in FIG. 6, the method starts at step S602, and the central buffer receives commands from the host controller via the memory interface. Next, in step S604, the central buffer determines whether a command is a write command. If the command is a write command, then in step S606, the central buffer determines whether the target address included in the command is a defective memory address according to the defective address information stored in its internal address recording module. If it is a defective memory address, then in step S608 the central buffer generates a repair write command, and send the repair write command to the data buffer. If it is not a defective memory address, then in step S610, the central buffer further determines whether the address recording module has unoccupied recording space: if there is no unoccupied recording space, then in step S612 the central buffer sends the write command to the data buffer; and if there is any unoccupied recording space, then in step S614, the central buffer stores the target address in the address recording module as the tested address, and generates a test write command and sends it to the data buffer. After steps S608, S612 and S614, step S616 is performed, and the data buffer performs the write operation to the memory module based on the corresponding data flows shown in FIG. 2A, FIG. 2B, and FIG. 4A according to the received write command, repair write command or test write command.

Returning to step S604, if the central buffer determines that the command is not a write command, then in step S618, the central buffer further determines whether the command is a read command. If it is a read command, then in step S620, the central buffer further checks the address recording module and determines whether the target address included in the read command is a defective memory address or a tested address. If it is not the two types of addresses, then in step S622, the central buffer directly sends the read command to the data buffer; if it is a defective memory address, then in step S624, the central buffer generates a repair read command and sends it to the data buffer; and if it is a tested address, then in step S626, the central buffer generates a test read command and sends it to the data buffer. After steps S622, S624 and S626, step S616 is performed, and the data buffer performs the read operation on the memory module based on the corresponding data flows shown in FIGS. 3A, 3B, and 4B according to the received read command, repair read command, or test read command.

If the central buffer determines in step S604 that the received command is not a read command but is another access command, then in step S628, the central buffer sends the command to the data buffer which performs the command in step S630. In this way, the entire access process ends, and the central buffer waits for the next command in step S632.

It can be understood that in some embodiments, some steps in the process shown in FIG. 6 may be omitted. For example, if only the testing of the defective memory address is performed, steps S606, S608, and S624 may be omitted; and if only the data repair of the defective memory address is performed, then steps S610, S614, and S626 may be omitted. Those skilled in the art may make adjustments according to actual application needs.

The memory system of the embodiments of the present application may be used in different computer systems.

As mentioned above, the memory system shown in FIG. 1 integrates therewith the function of testing and repairing the defective memory address, so that the defective memory addresses in the memory system can be tested and repaired by the memory system according to the access commands provided by the host controller. However, considering the mass storage capacity of the memory system, it is required that the host controller generates a large number of access commands to complete the defect testing for all memory cells in the memory system, and also executes the corresponding test program to generate these access commands. In order to improve the test efficiency, in some embodiments of the present application, a built-in test function is integrated within the memory system, which can generate a plurality of test access commands according to a predetermined address test algorithm, so as to test respective memory cells in the memory system. The built-in test function can be integrated in the central buffer and the data buffer.

Figure 7:
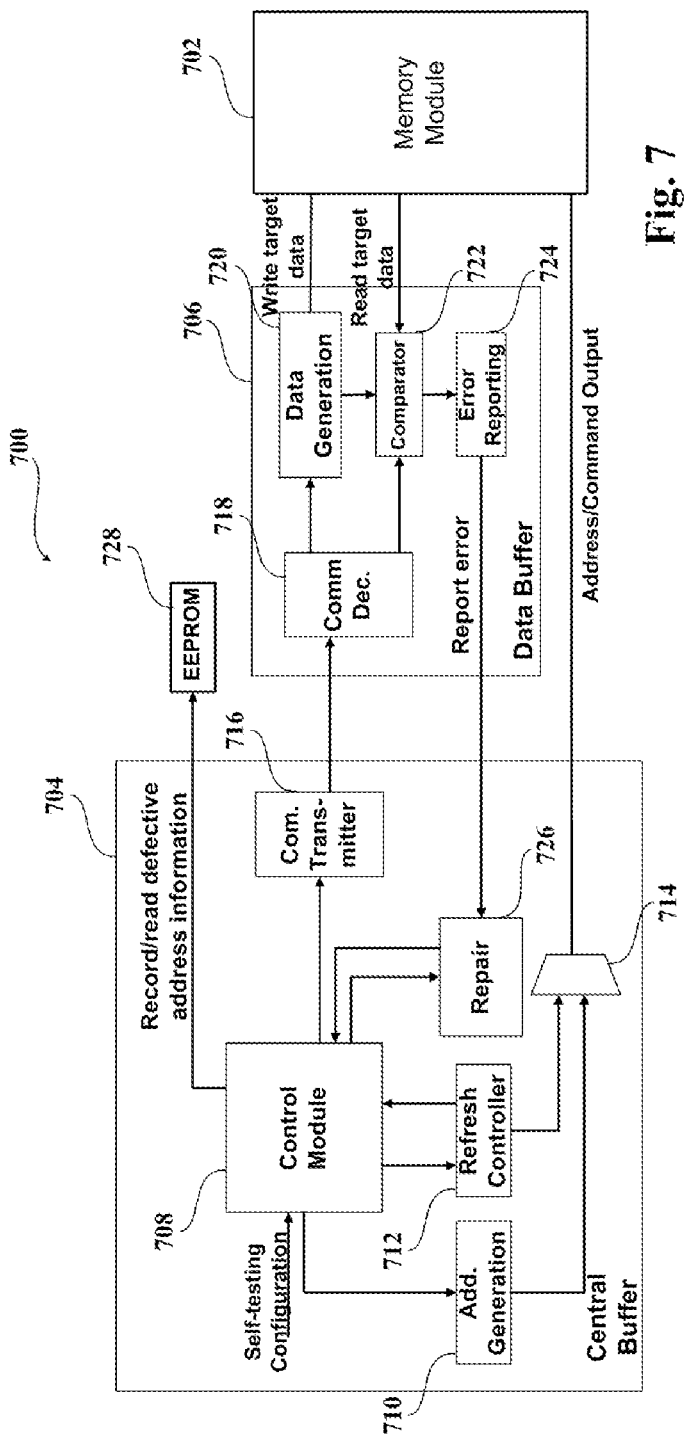
FIG. 7 illustrates a memory system 700 with built-in self-testing function according to an embodiment of the present application.

FIG. 7 shows a memory system 700 with a built-in self-testing function according to an embodiment of the present application. It should be noted that the memory system 700 may have a circuit structure compatible with current memory modules (for example, the circuit structure of the memory system shown in FIG. 1) to perform normal access operations to the memory module. This part of the circuit structure for performing normal access operations is not shown in its entirety in the embodiment shown in FIG.

7. FIG. 7 is an embodiment mainly for illustrating the circuit structure and the control signals associated with the built-in self-testing function.

As shown in FIG. 7, the memory system 700 includes one or more memory modules 702, only one of which is shown. In addition, the memory system 700 further includes a central buffer 704 and a data buffer 706, where the central buffer 704 is configured to receive access commands to access the memory module 702, for example, to receive an access command from the host controller via a memory interface (not shown in the figure). The data buffer 706 is coupled between the memory interface and the memory module 702 to buffer data transmitted therebetween under the control of the central buffer 704 (not shown).

In order to perform the self-testing function, the central buffer 704 includes a control module 708 for generating a test write command or a test read command to indicate testing to a target address in the memory module 702. Specifically, the control module 708 may be provided with a self-testing configuration port, so that the control module 708 may start a self-testing mode according to the self-testing configuration signal received via the self-testing configuration port. In the self-testing mode, a module for normal access control inside the central buffer 704, such as a command/address controller (not shown), may not be involved in the testing process temporarily.

A test write command and a test read command generated by the central buffer 704 may be sent to the data buffer 706 to test processed data when accessing (reading or writing) the memory module via the data buffer 706. Specifically, the central buffer 704 further includes an address generation module 710. After entering the self-testing mode, the control module 708 may indicate the address generation module 710 to generate a set of target addresses according to a predetermined address generation algorithm, where each address indicates a respective storage location of the memory module 702. In some embodiments, the target addresses generated by the address generation module 710 may cover the entire storage locations of the memory module 702 to completely test potential defects of the memory module 702. For example, the address generation module 710 may use the March test algorithm to generate a set of target addresses. In addition, under the control of a refresh controller 712, the target addresses generated by the address generation module 710 may be sequentially sent to the memory module 702 via a multiplexer 714 for addressing different storage locations in the memory module 702. Meanwhile, the control module 708 also sends a signal indicating the type of the access command (e.g., indicating the test write command or the test read command) and other control information, for example, in form of a BCOM command, to the data buffer 706 via a command transmitter 716. In some embodiments, the command transmitter 716 and a command decoder 718 in the data buffer 706 for receiving and decoding BCOM commands may use a protocol compatible with current BCOM commands, and reuse existing ports, such as, the examples shown in FIG. 5 as well as in Table 1 and Table 4. In other embodiments, the command transmitter 716 and the command decoder 718 may use a specially defined protocol and a separate port.

The data buffer 706 further includes a data generation module 720 for generating target data in response to a test write command and based on a predetermined data generation algorithm. It can be understood that each target data may be written into a target address generated by the address generation module 710 at the same time. In this way, the memory cell corresponding to the target address in the memory module 702 is written with the corresponding target data. In addition to being written into the memory module 702, the target data generated by the data generation module 720 is temporarily stored as a reference for subsequent comparison with the target data stored in the target address of the memory module. The temporarily stored target data that is used as a reference can be called repair data, which corresponds to the target address included in the test write command. In some embodiments, the data buffer 706 may have a data recording module similar to the embodiment shown in FIG. 1 for temporarily storing the repair data.

The data buffer 706 further includes a comparator 722 and an error reporting module 724. In response to a test read command, the comparator 722 receives target data read from the target address of the memory module 702 and repair data temporarily stored in the data recording module, and compares the target data with the repair data. In some embodiments, the comparator 722 may also directly receive the target data as repair data from the data generation module 720. A comparison result between the repair data and the target data may reflect whether the memory cell corresponding to the target address in the memory module has a defect, which uses the same principle as the online test described in the embodiment shown in FIG. 1 and will not be repeated here.

The comparator 722 may provide the comparison result to the central buffer 704 via the error reporting module 724. It can be understood that, in some embodiments, the error reporting module 724 may filter out comparison results indicating that the repair data is inconsistent with the target data, and only report these comparison results. In other embodiments, the error reporting module 724 may report all comparison results. In some embodiments, the error reporting module 724 may report the comparison result via the LBTXDQ and LBTXDQS pins, which may be compatible with current memory standards. In other embodiments, the error reporting module 724 may also be connected to the central buffer 704 via additional pins and report the comparison results to the central buffer 704.

The central buffer 704 may include a repair module 726 for receiving the comparison results associated with the respective tested addresses provided by the error reporting module 724 and adding the defective tested address into the defective address information according to their respective comparison results, wherein the defective address information is used to indicate the defective memory address(es) in the memory module 702. It can be understood that if the comparison results reported by the error reporting module 724 include both result(s) that the repair data is consistent with the target data and result(s) that the repair data is inconsistent with the target data, then the repair module 726 may only add the tested address(es) with defect(s) into the defective address information according to these comparison results. In some embodiments, the repair module 726 may include or be coupled to an address recording module (not shown in the figure) to record defective address information. It can be understood that, in some embodiments, the address recording module may record the defective address information and the tested address which is being tested. Further, the repair module 726 may cooperate with other modules of the central buffer 704 to repair the defective memory address(es). For more details of the defect repairing, the embodiments shown in FIG. 1 to FIG. 6 can be referred to, and will not be repeated here.

The address recording module integrated in the central buffer 704 can be implemented by register(s), and thus it can only store data and information when the central buffer 704 is powered on. In order to store the defective address information even if the memory system is powered off, in some embodiments, the central buffer 704 may be coupled to a non-transitory storage medium, such as a flash memory or an EEPROM 728, and record into the non-transitory storage medium the defective address information which is determined after the self-testing is completed. When the memory system is coupled to a computer system which is powered on, the central buffer 704 can read the defective address information from the EEPROM 728 to facilitate subsequent defect repairing.

It can be seen that, since the control module, the address generation module, and the data generation module are configured in the central buffer and the data buffer, the memory system 700 can implement the self-testing function. In practical applications, memory device manufacturing companies can set their memory systems to run the self-testing before delivery, to identify potential defects in the memory systems, and preferably the defective address information can be pre-stored in non-transitory storage mediums or other address recording module. Such testing method does not require complicated external software or device, which improves the test efficiency.

Figure 8:
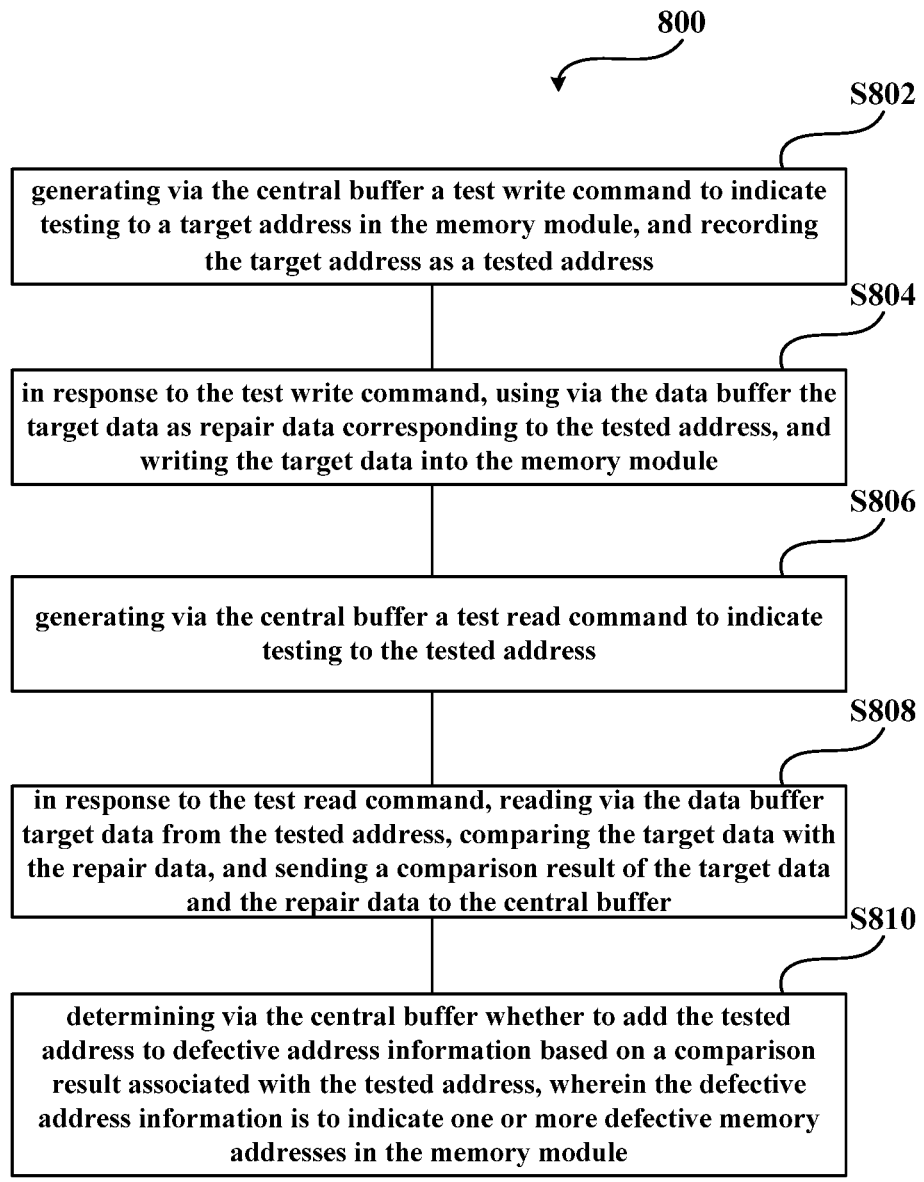
FIG. 8 illustrates a method 800 for testing a defect of a memory module according to an embodiment of the present application.

FIG. 8 illustrates a method 800 for testing a defect of a memory module according to an embodiment of the present application. In some embodiments, the method 800 may be performed by the apparatus shown in FIG. 1 or the apparatus shown in FIG. 7.

As shown in FIG. 8, the method 800 includes: step S802, generating via the central buffer a test write command to indicate testing to a target address in the memory module, and recording the target address as a tested address; step S804, in response to the test write command, using via the data buffer the target data as repair data corresponding to the tested address, and writing the target data to the memory module; step S806, generating via the central buffer a test read command to indicate testing to the tested address; step S808, in response to the test read command, reading via the data buffer the target data from the tested address and comparing the target data with the repair data, and sending a comparison result of the target data and the repair data to the central buffer; and the step S810: determining via the central buffer whether to add the tested address to the defective address information based on a comparison result associated with the tested address, where the defective address information is configured to indicate a defective memory address in the memory module.

In some embodiments, the central buffer comprises an address recording module for storing the defective address information and the tested address. Before step S802, the method 800 further comprises: receiving via the central buffer a write command for writing into the target address from the memory interface; and when the target address included in the write command is not included in the defective address information and the address recording module has unoccupied address recording space, performing step S802.

In some embodiments, before step S806, the method 800 further comprises: receiving via the central buffer a read command for reading from the target address from the memory interface; checking via the central buffer whether the target address included in the read command belongs to the tested address, and when it is determined that the target address belongs to the tested address, performing step S806.

In some embodiments, step S802 further comprises: generating a target address in the memory module based on a predetermined address generation algorithm; and generating a test write command including the target address based on the generated target address.

In some embodiments, step S806 further comprises: generating a test read command including the target address based on the generated target address.

In some embodiments, step S804 further comprises: generating via the data buffer the target data based on a predetermined data generation algorithm.

In some embodiments, step S804 further comprises: receiving via the data buffer the target data from the memory interface.

In some embodiments, step S804 comprises: recording via the data buffer the target data in the data recording module in the data buffer as the repair data; and step S808 further comprises: reading via the data buffer the repair data from the data recording module.

In some embodiments, after step S810, the method 800 further comprises storing via the central buffer the defective address information in a non-transitory memory medium.

In some embodiments, after step S810, the method 800 further comprises: receiving via the central buffer an access command for accessing a target address in the memory module from the memory interface; and comparing via the central buffer the target address and the defective address information, and determining whether to generate a repair access command for repairing the target address according to the comparison result; receiving via the data buffer the access command or the repair access command, wherein the data buffer comprises a data recording module for recording repair data; and writing via the data buffer the target data associated with the access command into the data recording module as repair data corresponding to the target address according to the repair access command, or reading the repair data from the data recording module as the target data corresponding to the target address.

It should be noted that although the apparatus and method for repairing and testing the defective memory modules and the several modules or submodules, steps or sub-steps of the memory system are mentioned in the above detailed description, this division is merely exemplary rather than mandatory. In fact, according to the embodiments of the present application, the features and functions of the two or more modules described above may be embodied in one module. In contrast, the features and functions of a module described above can be further divided into multiple modules to be embodied.

Those skilled in the art may understand and implement other changes to the disclosed embodiments by studying the specification, the disclosure, the drawings, and the appended claims. In the claims, the wording "comprising" does not exclude other elements and steps, and the wording "a" and "one" does not exclude plurals. In the practical application of the present application, one part may perform the functions of multiple technical features referred to the claims. Any reference numerals in the claims should not be construed as a limitation to the scope.

What is claimed is:

1. An apparatus for testing defects of a memory module, wherein the apparatus comprises: a central buffer for receiving an access command for accessing the memory module, and for generating a test write command and a test read command to indicate testing to a target address in the memory module; and a data buffer coupled between a memory interface and the memory module to buffer data transmitted therebetween, and coupled to the central buffer to receive the test write command and the test read command; wherein the data buffer further comprises a data recording module for recording repair data, and wherein the data buffer is configured to, in response to the test write command, use target data as repair data corresponding to the target address and write the target data into the memory module; and, in response to the test read command, to read target data from the target address and compare the target data with the repair data, and to send to the central buffer a comparison result of the target data and the repair data; wherein the central buffer is further configured to record the target address as a tested address when generating the test write command, and determine whether to add the tested address to defective address information based on the comparison result associated with the tested address, wherein the defective address information is to indicate one or more defective memory addresses in the memory module; and wherein the central buffer is further configured to compare the target address included in a received access command with defective address information, and determine whether to generate a repair access command to repair the target address according to a comparison result of the target address included in the received access command and the defective address information; and wherein the data buffer is further configured for, according to the repair access command, writing target data associated with the access command into the data recording module as repair data corresponding to the target address or reading repair data from the data recording module as target data corresponding to the target address.

2. The apparatus of claim 1, wherein the central buffer has an address recording module for recording the defective address information and the tested address; the central buffer is coupled to the memory interface for receiving from the memory interface a write command to write data into the target address, and the central buffer is configured to: when the target address included in the write command is not included in the defective address information and the address recording module has unoccupied address recording space, generate the test write command to indicate testing to the target address included in the write command; or receive from the memory interface a read command to read data from the target address, check whether the target address included in the read command is a tested address, and generate the test read command when it is determined that the target address included in the read command is a tested address.

3. The apparatus of claim 1, wherein the central buffer further comprises:
an address generation module for generating one or more target addresses in the memory module based on a predetermined address generation algorithm; and
a control module for indicating the address generation module to generate the target addresses and provide the test write command or test read command to the data buffer, and determine whether to add the tested address to the defective address information based on the comparison result.

4. The apparatus of claim 1, wherein the data buffer further comprises:
a data generation module for generating target data based on a predetermined data generation algorithm in response to the test write command, wherein the target data corresponds to the target address included in the test write command;
a comparator for comparing the repair data with the target data read from the target address; and an error reporting module for providing a comparison result between the repair data and the target data to the central buffer.

5. The apparatus of claim 4, wherein the data recording module is configured for receiving and recording the target data from the data generating module as the repair data; and the comparator is also configured to receive the repair data from the data recording module.

6. The apparatus of claim 4, wherein the comparator is further configured to receive the target data from the data generation module as the repair data.

7. The apparatus of claim 1, wherein the apparatus further comprises a non-transitory memory medium, and the central buffer is further configured to store the defective address information in the non-transitory memory medium.

8. A memory system having a built-in self-testing function, wherein the memory system includes the apparatus for testing defects of a memory module according to claim 1.

9. A method for testing defects of a memory module, wherein the memory module is coupled to a central buffer and a data buffer which are coupled to each other, wherein the central buffer and the data buffer are also respectively coupled to a memory interface, the method comprises:
a) generating via the central buffer a test write command to indicate testing to a target address in the memory module, and recording the target address as a tested address;
b) in response to the test write command, using via the data buffer target data as repair data corresponding to the tested address, and writing the target data into the memory module;
c) generating via the central buffer a test read command to indicate testing to the tested address;
d) in response to the test read command, reading via the data buffer target data from the tested address, comparing the target data with the repair data, and sending a comparison result of the target data and the repair data to the central buffer; and
e) determining via the central buffer whether to add the tested address to defective address information based on a comparison result associated with the tested address, wherein the defective address information is to indicate one or more defective memory addresses in the memory module;
f) receiving via the central buffer and from the memory interface an access command to access the target address in the memory module;
g) comparing via the central buffer the target address with the defective address information, and determining whether to generate a repair access command for repairing the target address according to the comparison result;
h) receiving via the data buffer the access command or the repair access command, wherein the data buffer comprises a data recording module for recording repair data; and
i) according to the repair access command, writing via the data buffer target data associated with the access command into the data recording module as repair data corresponding to the target address, or reading the repair data from the data recording module as target data corresponding to the target address.

10. The method of claim 9, wherein the central buffer comprises an address recording module for storing the defective address information and the tested address; before step a, the method further comprises: receiving via the central buffer and from the memory interface a write command to write data into the target address; and when a target address included in the write command is not included in the defective address information and the address recording module has unoccupied address recording space, performing step a.

11. The method of claim 10, wherein before step c, the method further comprises:
receiving via the central buffer and from the memory interface a read command to read data from the target address;
checking via the central buffer whether the target address included in the read command is a tested address, and
when determining that the target address is a tested address, performing step c.

12. The method of claim 9, wherein step a comprises:
generating one or more target addresses in the memory module based on a predetermined address generation algorithm; and
generating test write commands including the respective target addresses based on the generated target addresses.

13. The method of claim 12, wherein step c comprises:
generating test read commands including the respective target addresses based on the generated target addresses.

14. The method of claim 9, wherein step b comprises:
generating via the data buffer target data based on a predetermined data generation algorithm.

15. The method of claim 9, wherein step b comprises:
receiving via the data buffer the target data from the memory interface.

16. The method of claim 9, wherein step b comprises:
recording via the data buffer the target data in the data recording module in the data buffer as the repair data; and
step d comprises: reading via the data buffer the repair data from the data recording module.

17. The method of claim 9, wherein after step e, the method further comprises:
storing via the central buffer the defective address information in a non-transitory memory medium.

* * * * *